United States Patent
Takeda

(10) Patent No.: US 9,607,908 B1
(45) Date of Patent: Mar. 28, 2017

(54) METHOD OF MANUFACTURING SEMICONDUCTOR DEVICE

(71) Applicant: Hitachi Kokusai Electric Inc., Tokyo (JP)

(72) Inventor: Tsuyoshi Takeda, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 15/273,330

(22) Filed: Sep. 22, 2016

(30) Foreign Application Priority Data

Jul. 11, 2016 (JP) .................................. 2016-136756

(51) Int. Cl.
| | |
|---|---|
| H01L 21/02 | (2006.01) |
| H01L 21/66 | (2006.01) |
| H01L 21/3065 | (2006.01) |
| H01L 21/265 | (2006.01) |

(52) U.S. Cl.
CPC ............ *H01L 22/20* (2013.01); *H01L 21/265* (2013.01); *H01L 21/3065* (2013.01); *H01L 22/12* (2013.01)

(58) Field of Classification Search
CPC ........... H01L 21/0228; H01L 21/02211; H01L 21/02274; H01L 21/02126; H01L 21/0217
USPC ........................... 118/696, 704; 438/763, 478
See application file for complete search history.

(56) References Cited

U.S. PATENT DOCUMENTS

| | | | | |
|---|---|---|---|---|
| 9,070,554 | B2 * | 6/2015 | Toyoda | C23C 16/45557 |
| 9,093,270 | B2 * | 7/2015 | Hirose | H01L 21/67109 |
| 2014/0220788 | A1 * | 8/2014 | Sano | H01L 21/67109 |
| | | | | 438/775 |
| 2015/0111395 | A1 * | 4/2015 | Hashimoto | C23C 16/45544 |
| | | | | 438/794 |
| 2015/0252474 | A1 * | 9/2015 | Itatani | C23C 16/4584 |
| | | | | 438/758 |

FOREIGN PATENT DOCUMENTS

| | | |
|---|---|---|
| JP | 2012-193457 A | 10/2012 |
| JP | 2013-187226 A | 9/2013 |
| JP | 2014-082338 A | 5/2014 |

\* cited by examiner

*Primary Examiner* — David Vu
*Assistant Examiner* — Jonathan Han
(74) *Attorney, Agent, or Firm* — Edell, Shapiro & Finnan, LLC

(57) ABSTRACT

Provided is a technique capable of uniformizing the characteristics of a film after a plurality of substrates are processed. A method of manufacturing a semiconductor device may include: (a) loading a substrate into a process chamber; (b) processing the substrate by performing: (b-1) supplying and exhausting a process gas into and from the process chamber without activating the process gas; (b-2) supplying and exhausting the process gas into and from the process chamber while activating the process gas; (b-3) measuring an amount of impurity desorbed from the substrate while performing (b-2); and (b-4) measuring a gas exhausted from the process chamber after performing (b-3); (c) calculating a process data based on: a first measurement data obtained by repeating (b-3); and a second measurement data obtained by repeating (b-4); and (d) determining whether to terminate (b) based on the process data.

15 Claims, 6 Drawing Sheets

METHOD OF MANUFACTURING SEMICONDUCTOR DEVICE

CROSS REFERENCE TO RELATED APPLICATIONS

This application claims foreign priority under 35 U.S.C. §119(a)-(d) to Japanese Patent Application No. 2016-136756, filed on Jul. 11, 2016, the entire contents of which are hereby incorporated by reference.

FIELD OF THE INVENTION

The present disclosure relates to a method of manufacturing a semiconductor device.

BACKGROUND

Semiconductor devices such as a large scale integrated circuit (LSI), dynamic random access memory (DRAM) and flash memory have been highly integrated. Thus, a circuit pattern or a structure formed in a process of manufacturing a semiconductor device has been miniaturized. Examples of a process for miniaturization in the process of manufacturing a semiconductor device may include changing the characteristics of a film after a substrate is processed.

The process of changing the characteristics of a film has a problem in that the characteristics of a film on each substrate may differ depending on the state of the film.

SUMMARY

Described herein is a technique capable of improving the uniformity in characteristics of a film after a substrate is processed.

According to one aspect described herein, a method of manufacturing a semiconductor device may include: (a) loading a substrate into a process chamber; (b) processing the substrate by performing: (b-1) supplying and exhausting a process gas into and from the process chamber without activating the process gas; (b-2) supplying and exhausting the process gas into and from the process chamber while activating the process gas; (b-3) measuring an amount of impurity desorbed from the substrate while performing the step (b-2); and (b-4) measuring a gas exhausted from the process chamber after performing the step (b-3); (c) calculating a process data based on: a first measurement data obtained by repeating (b-3); and a second measurement data obtained by repeating (b-4); and (d) determining whether to terminate the step (b) based on the process data.

DETAILED DESCRIPTION

Hereafter, embodiments will be described.

First Embodiment

Hereafter, an embodiment will be described with reference to the accompanying drawings.

(1) Configuration of Substrate Processing Apparatus

First, a substrate processing apparatus according to the present embodiment will be described.

The substrate processing apparatus 100 according to the present embodiment will be described. The substrate processing apparatus 100 is an insulation film forming unit, for example, and a single-wafer type substrate processing apparatus as illustrated in FIG. 1.

Figure 1:
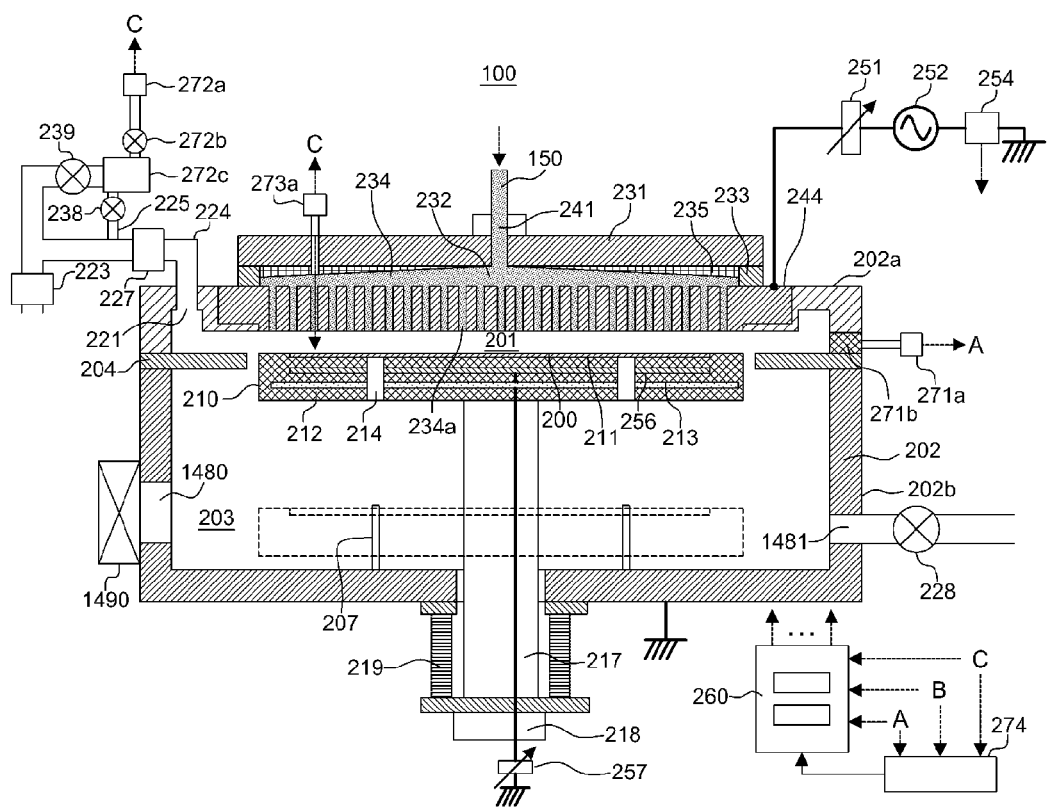
FIG. 1 is a diagram schematically illustrating a substrate processing apparatus according to one embodiment described herein.

As illustrated in FIG. 1, the substrate processing apparatus 100 includes a process container 202. The process container 202 has a circular cross-sectional surface, and is a flat airtight container. The process container 202 is formed of quartz or a metal such as aluminum (Al) and stainless steel (SUS). The process container 202 includes a transfer space (transfer chamber) 203 and a process space (process chamber) 201 where a wafer 200 such as a silicon substrate is processed. The process container 202 includes an upper container 202a and a lower container 202b. Between the upper container 202a and the lower container 202b, a partition plate 204 is installed. The space above the partition plate 204, surrounded by the upper container 202a, is referred to as the process chamber 201, and the space under the partition plate 204, surrounded by the lower container 202b, is referred to as the transfer chamber 203.

The lower container 202b has a substrate loading/unloading port 1480 formed at a side surface thereof, the substrate loading/unloading port 1480 being adjacent to a gate valve 1490. The wafer 200 is moved between a transfer chamber (not illustrated) and the transfer chamber 203 through the substrate loading/unloading port 1480. The lower container 202b has a plurality of lift pins 207 installed at the bottom thereof. The lower container 202b is grounded.

The process chamber 201 has a substrate support 210 installed therein, the substrate support 210 supporting the wafer 200. The substrate support 210 includes a substrate placing table 212 and a heater 213. The substrate placing table 212 has a substrate placing surface 211 on which a wafer 200 is placed, and the heater 213 serves as a heating unit. The substrate placing table 212 has a plurality of through-holes 214 through which the respective lift pins 207 are passed, the plurality of through-holes 214 being formed at positions corresponding to the respective lift pins 207. The substrate placing table 212 may include a bias electrode 256 for applying a bias to the wafer 200 or the process chamber 201. The bias electrode 256 may be connected to a bias adjusting unit 257, and a bias may be adjusted by the bias adjusting unit 257.

The substrate placing table 212 is supported by a shaft 217. The shaft 217 is formed through the bottom portion of the process container 202, and connected to an elevating mechanism 218 outside the container 202. As the elevating mechanism 218 is operated to lift/lower the shaft 217 and the substrate placing table 212, the wafer 200 placed on the substrate placing surface 211 can be lifted/lowered. The lower end portion of the shaft 217 is covered by a bellows 219. The inside of the process chamber 201 is airtightly maintained.

When the wafer 200 is transferred, the substrate placing table 212 is lowered to a wafer transfer position indicated by a dotted line of FIG. 1. When the wafer 200 is processed, the substrate placing table 212 is lifted to a wafer processing position as illustrated in FIG. 1.

Specifically, when the substrate placing table 212 is lowered until the substrate placing table 212 reaches the wafer transfer position, the upper ends of the lift pins 207 protrude from the substrate placing surface 211, and the lift pins 207 support the wafer 200 from thereunder. When the substrate placing table 212 is lifted until the substrate placing table 212 reaches the wafer processing position, the lift pins 207 are buried from the substrate placing surface 211, and the substrate placing surface 211 supports the wafer 200 from thereunder. Since the lift pins 207 are in direct contact with the wafer 200, the lift pins 207 may be formed of a material such as quartz or alumina.

(First Measuring Unit)

The upper container 202a has a window 271b installed at one side thereof, the window 271b being connected to a spectroscope serving as a first measuring unit 271a. The window 271b includes a window which transmits ultraviolet light or far-infrared light, for example. The spectroscope serving as the first measuring unit 271a can measure the light intensity of a gas which is desorbed from the wafer 200 by plasma generated in the process chamber 201. The measurement data generated by the spectroscope may be transmitted to a controller 260 or a lock-in amplifier 274 serving as a process data generation unit.

(Exhaust System)

An exhaust port 221 serving as a first exhaust unit for exhausting the atmosphere of the process chamber 201 is installed at the upper portion of the process chamber 201 [upper container 202a]. The exhaust port 221 is connected to an exhaust pipe 224. A pressure controller 227 and a vacuum pump 223 are sequentially connected in series to the exhaust pipe 224, the pressure controller 227 including an APC (Automatic Pressure Controller) for controlling the inner pressure of the process chamber 210. The first exhaust system (exhaust line) is constituted by the exhaust port 221, the exhaust pipe 224 and the pressure controller 227. The first exhaust system may further include the vacuum pump 223. An exhaust pipe 1481 for exhausting the atmosphere of the transfer chamber 203 is installed at the lower portion of the inner wall of the transfer chamber 203. The exhaust pipe 1481 has a pressure controller 228 installed thereon. The transfer chamber 203 can be exhausted by the exhaust pipe 1481 and the pressure controller 228. The inner atmosphere of the process chamber 201 may also be exhausted through the transfer chamber 203 by the exhaust pipe 1481 and the pressure controller 228.

(Second Measuring Unit)

The exhaust pipe 224 is connected to a measuring chamber 272c and a second measuring unit introduction pipe 225 for supplying a part of exhaust gas to a second measuring unit 272a. The second measuring unit introduction pipe 225 has a valve 238 installed thereon. The valve 238 is opened when a gas is analyzed by the second measuring unit 272a. The valve 238 may include a component such as an orifice, a needle valve, an MFC and the like. The measuring chamber 272c is connected to the vacuum pump 223 through a valve 239. The vacuum pump 223 controls the inner pressure of the measuring chamber 272c. The vacuum pump 223 exhausts the inside of the measuring chamber 272c until the inner pressure of the measuring chamber 272c reaches a predetermined value ranging from 0.1 Pa to 10-5 Pa. The second measuring unit 272a is constituted by a mass spectrometer (not illustrated). The mass spectrometer measures a gas molecular weight in the exhaust gas introduced into the measuring chamber 272c. The measurement data generated by the mass spectrometer may be transmitted to the controller 260 or the lock-in amplifier 274.

(Gas Inlet Port)

A gas inlet port 241b for supplying various gases into the process chamber 201 is installed at the top (ceiling) of a shower head 234 installed at the top of the process chamber 201. Gas supply units connected to the gas inlet port 241 will be described later.

(Gas Dispersion Unit)

The shower head 234 serving as a gas dispersion unit includes a buffer chamber 232 and an electrode unit 244 serving as an activation unit. The electrode unit 244 includes a plurality of holes 234a for dispersing and supplying a gas to the wafer 200. The shower head 234 is installed between the gas inlet port 241 and the process chamber 201. A gas introduced through the gas inlet port 241 is supplied into the buffer chamber (dispersion unit) 232 of the shower head 234, and supplied into the process chamber 201 through the plurality of holes 234a.

The electrode unit 244 which is a part of the activation unit (excitation unit) configured to excite a gas is made of a conductive metal. A matcher 251 and a high-frequency power supply 252 may be connected to the electrode unit 244, and supply electromagnetic waves (high-frequency power or microwaves). When a lid 231 is made of a conductive material, an insulation block 233 is installed between the lid 231 and the electrode unit 244. The insulation block 233 insulates the lid 231 from the electrode unit 244. The electrode unit 244 is supported by the upper container 202a. The activation unit is constituted by at least the electrode unit 244, the matcher 251 and the high-frequency power supply 252. Between the high-frequency power supply 252 and a ground, a pulse generation unit 254 is installed.

The buffer chamber 232 may have a gas guide 235 installed therein. The gas guide 235 has the gas inlet port 241 formed in the center thereof, and is cone-shaped with the diameter thereof increasing toward the outer circumference thereof. The lowermost end portion of the gas guide 235 is disposed outer than the outermost hole 234a. The installation of the gas guide 235 can uniformly supply a gas to the respective holes 234a, and uniformize the amount of active species supplied onto the surface of the wafer 200.

(Third Measuring Unit)

The lid 231 includes a third measuring unit 273a serving as a displacement measuring unit. The displacement measuring unit can measure the level of the surface of the wafer 200 by irradiating laser light and the like onto the wafer 200. The lid 231 and the electrode unit 244 have a hole or a window for passing laser light. The third measuring unit 273a can measure a deformation (bending) of the wafer 200 by measuring the distance between the third measuring unit 273a and the surface of the wafer 200. The measurement data generated by the third measuring unit 273a may be transmitted to the controller 260 or the lock-in amplifier 274. The third measuring unit 273a may measure the position of the surface of the wafer 200, instead of the distance between the third measuring unit 273a and the surface of the wafer 200.

(Gas Supply System)

The gas inlet port 241 is connected to a gas supply pipe 150. Through the gas supply pipe 150, a first gas, a second gas and an inert gas which are described later are supplied.

Figure 2:
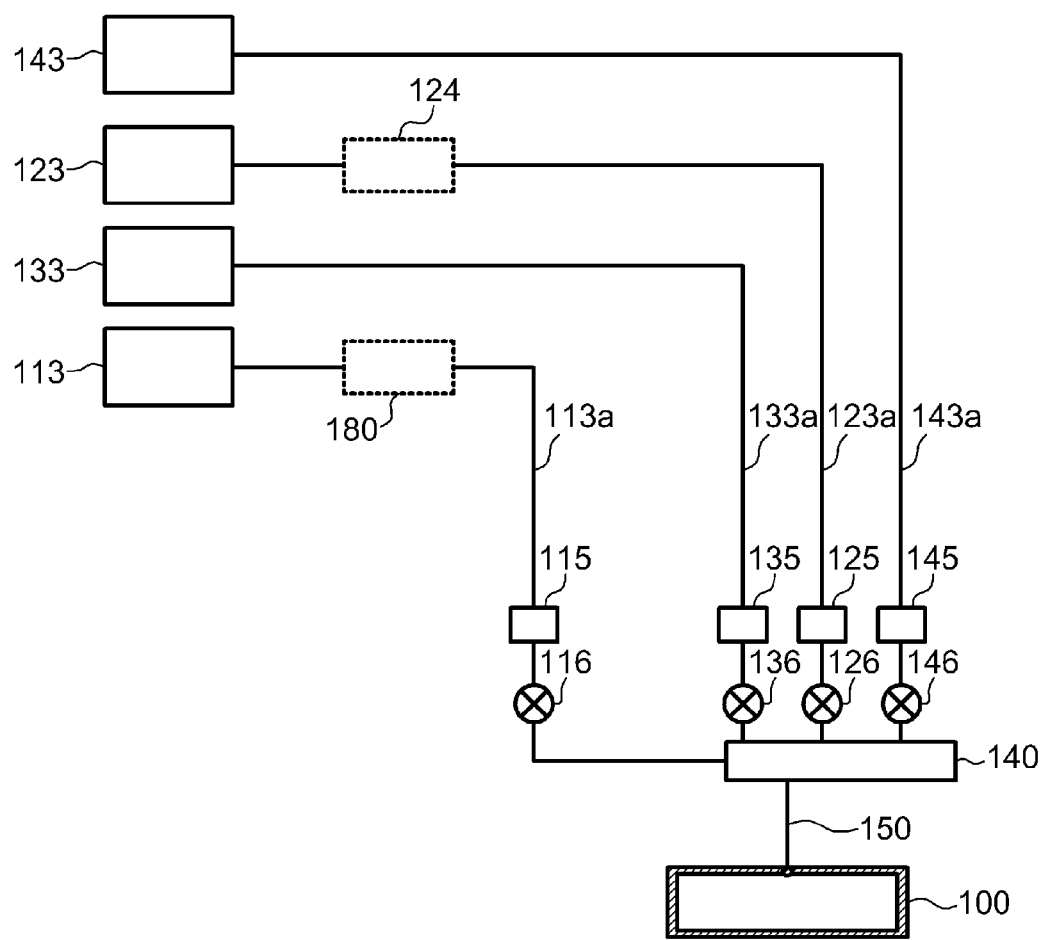
FIG. 2 is a diagram schematically illustrating a gas supply system according to the embodiment described herein.

FIG. 2 illustrates a schematic configuration of a first gas supply unit, a second gas supply unit, an inert gas supply unit and a third gas supply unit.

As illustrated in FIG. 2, the gas supply pipe 150 is a gas supply pipe aggregation unit 140. The gas supply pipe aggregation unit 140 is connected to a first gas supply pipe 113a, a second gas supply pipe 123a, an inert gas supply pipe 133a and a third gas (treatment gas) supply pipe 143a.

(First Gas Supply Unit)

The first gas supply unit includes the first gas supply pipe 113a. From the upstream side toward the downstream side of the first gas supply pipe 113a, an MFC 115a and a valve 116 are sequentially installed at the first gas supply pipe 113a. The first gas supply unit may further include a first gas supply source 113 connected to the first gas supply pipe 113a. When the raw material of a process gas is liquid or solid, a vaporizer 180 may be installed at the first gas supply pipe 113a.

(Second Gas Supply Unit)

The second gas supply unit includes the second gas supply pipe 123a. From the upstream side toward the downstream side of the second gas supply pipe 123a, an MFC 125 and a valve 126 are sequentially installed at the second gas supply pipe 123a. The second gas supply unit may further include a second gas supply source 123 connected to the second gas supply pipe 123a. A remote plasma unit (RPU) 124 may be installed at the second gas supply pipe 123a. The RPU 124 activates a second gas.

(Inert Gas Supply Unit)

The inert gas supply unit includes an inert gas supply pipe 133a. From the upstream side toward the downstream side of the inert gas supply pipe 133a, an MFC 135 and a valve 136 are sequentially installed at the inert gas supply pipe 133a. The inert gas supply unit may further include an inert gas supply source 133 connected to the inert gas supply pipe 133a.

(Third Gas Supply Unit)

The third gas supply unit includes the third gas supply pipe 143a. The third gas supply unit is also referred to as a treatment gas supply unit or modification gas supply unit. From the upstream side toward the downstream side of the third gas supply pipe 143a, an MFC 145 and a valve 146 are sequentially installed at the third gas supply pipe 143a. The third gas supply unit may further include a third gas supply source 143 connected to the third gas supply pipe 143a.

In the present embodiment, at least any one of the first to third gas supply units and the inert gas supply unit or combinations thereof may be referred to as a gas supply unit.

(Control Unit)

As illustrated in FIG. 1, the substrate processing apparatus 100 includes a controller 260 for controlling the operations of the components of the substrate processing apparatus 100.

Figure 3:
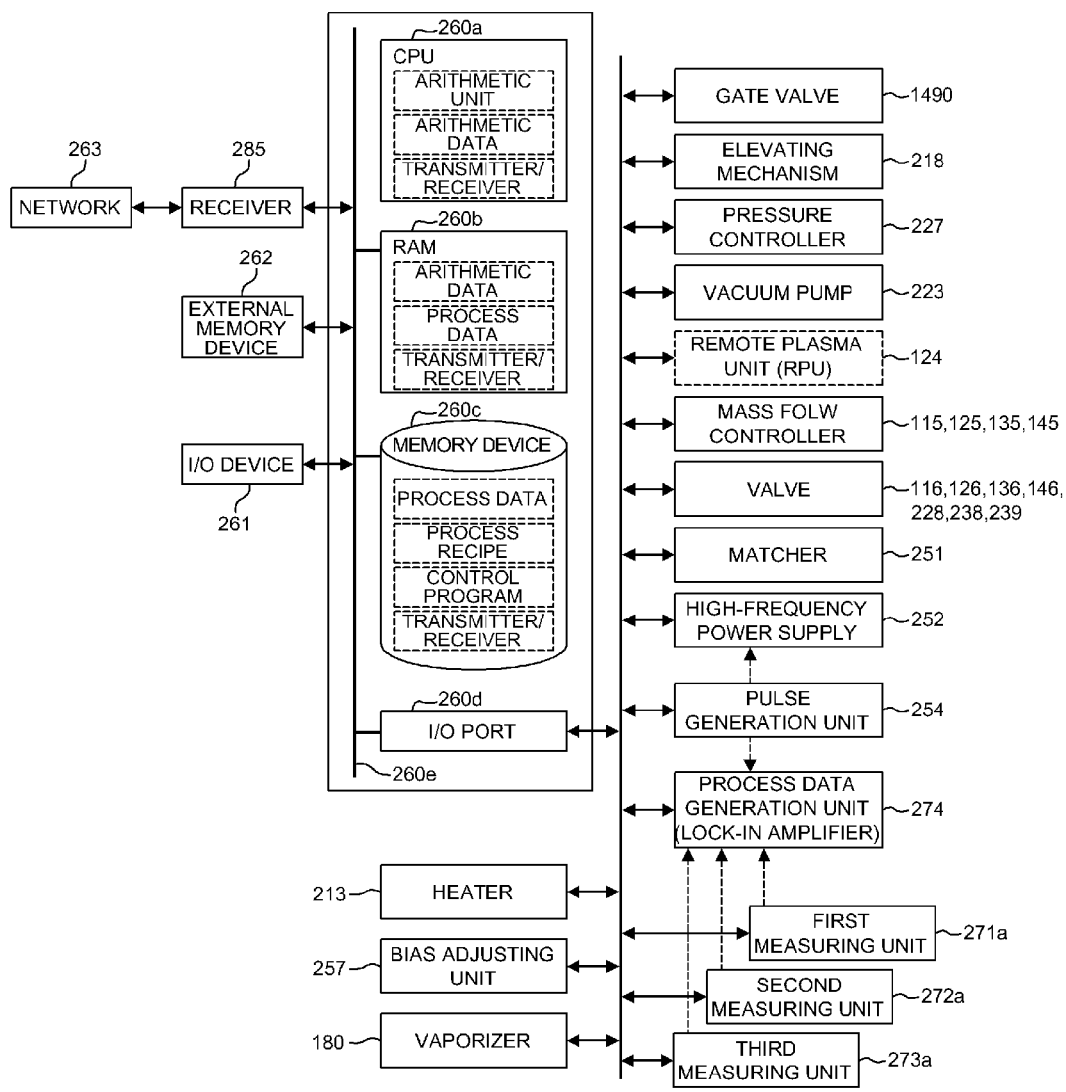
FIG. 3 is a diagram schematically illustrating a controller of the substrate processing apparatus according to the embodiment described herein.

FIG. 3 schematically illustrates the controller 260. The controller 260 serving as a control unit is embodied by a computer including a CPU (Central Processing Unit) 260a, a RAM (Random Access Memory) 260b, a memory device 260c and an I/O port 260d. The RAM 260b, the memory device 260c and the I/O port 260d may exchange data with the CPU 260a through an internal bus 260e. The controller 260 may be connected to components such as a receiver 285, an external memory device 262 and an I/O device 261 such as a touch panel.

The memory device 260c is embodied by a flash memory or HDD (Hard Disk Drive), for example. The memory device 260c readably stores a control program for controlling an operation of the substrate processing apparatus, a process recipe describing the sequence or condition of a substrate processing step described later, or data such as arithmetic data or process data which is generated during a process for setting a process recipe used for processing the wafer 200. The process recipe includes steps of the substrate processing step described later, which are combined to acquire a predetermined result through the controller 260, and functions as a program. Hereafter, the program recipe and the control program are collectively referred to as a program. In this specification, the term 'program' may indicate only a program recipe, indicate only a control program, or indicate both of the program recipe and the control program. The RAM 260b functions as a work area in which a program, arithmetic data and process data read by the CPU 260a are temporarily stored.

The I/O port 260d is connected to components such as the gate valve 1490, the elevating mechanism 218, the heater 213, the pressure controller 227, the vacuum pump 223, the matcher 251, the high-frequency power supply 252, the MFCs 115, 125, 135 and 145, the valves 116, 126, 136, 228, 238 and 239, the RPU 124, the vaporizer 180, the bias adjusting unit 257, the pulse generation unit 254, the first measuring unit 271a, the second measuring unit 272a, the third measuring unit 273a and the lock-in amplifier 274.

The CPU 260a serving as an arithmetic unit reads a control program from the memory device 260c, and executes the control program. Furthermore, the CPU 260a reads a process recipe from the memory device 260c in response to an input of operation command from the I/O device 260. The CPU 260a may compare a setting value inputted from the receiver 285 to a process recipe or control data stored in the memory device 260c, and compute arithmetic data. The CPU 260a is configured to perform a process of determining corresponding process data (process recipe), based on the arithmetic data. The CPU 260a controls an opening/closing operation of the gate valve 1490, a lifting/lowering operation of the elevating mechanism 218, a power supply operation to the heater 213, a pressure control operation of the pressure controller 227, an on/off control operation for the vacuum pump 223, gas flow rate control operations of the MFCs 115, 125, 135 and 145, a gas activation operation of the RPU 124, on/off control operations for the valves 116, 126, 136, 228, 238 and 239, a power matching operation of the matcher 251, a power control operation of the high-frequency power supply 252, and an adjusting operation of the bias adjusting unit 257, according to the contents of the read process recipe. The CPU 260a may control the operations of the matcher 251 and the high-frequency power supply 252, based on one or more pieces of information of the first to third measuring units 271a through 273a and the pulse generation unit 254. When the CPU 260a controls the respective components, a transmitter/receiver in the CPU 260a transmits/receives control information according to the contents of the process recipe.

The controller 260 is not limited to a dedicated computer, but may be embodied by a general purpose computer. For example, the external memory device 262 storing the above-described program may be prepared, and a program may be installed in a general purpose computer through the external memory device 262, in order to embody the controller 260 according to the present embodiment. The external memory device 262 may include magnetic disks such as a magnetic tape, flexible disk and hard disk, optical disks such as CD and DVD, a magneto-optical disk such as MO, and semiconductor memories such as a USB flash drive and memory card. The supply of a program to the computer is not limited to the case in which the program is supplied through the external memory device 262. For example, the program may be supplied through a communication unit such as the receiver 285 and a network 263 (Internet or dedicated line), without the external memory device 262. The memory device 260c and the external memory device 262 may be embodied by transitory computer readable recording media. Hereafter, they are collectively referred to as recording media. In this specification, the term 'recording media' may indicate only the memory device 260c, indicate only the external memory device 262, or indicate both of the memory device 260c and the external memory device 262.

(2) Substrate Processing Step

Figure 4:
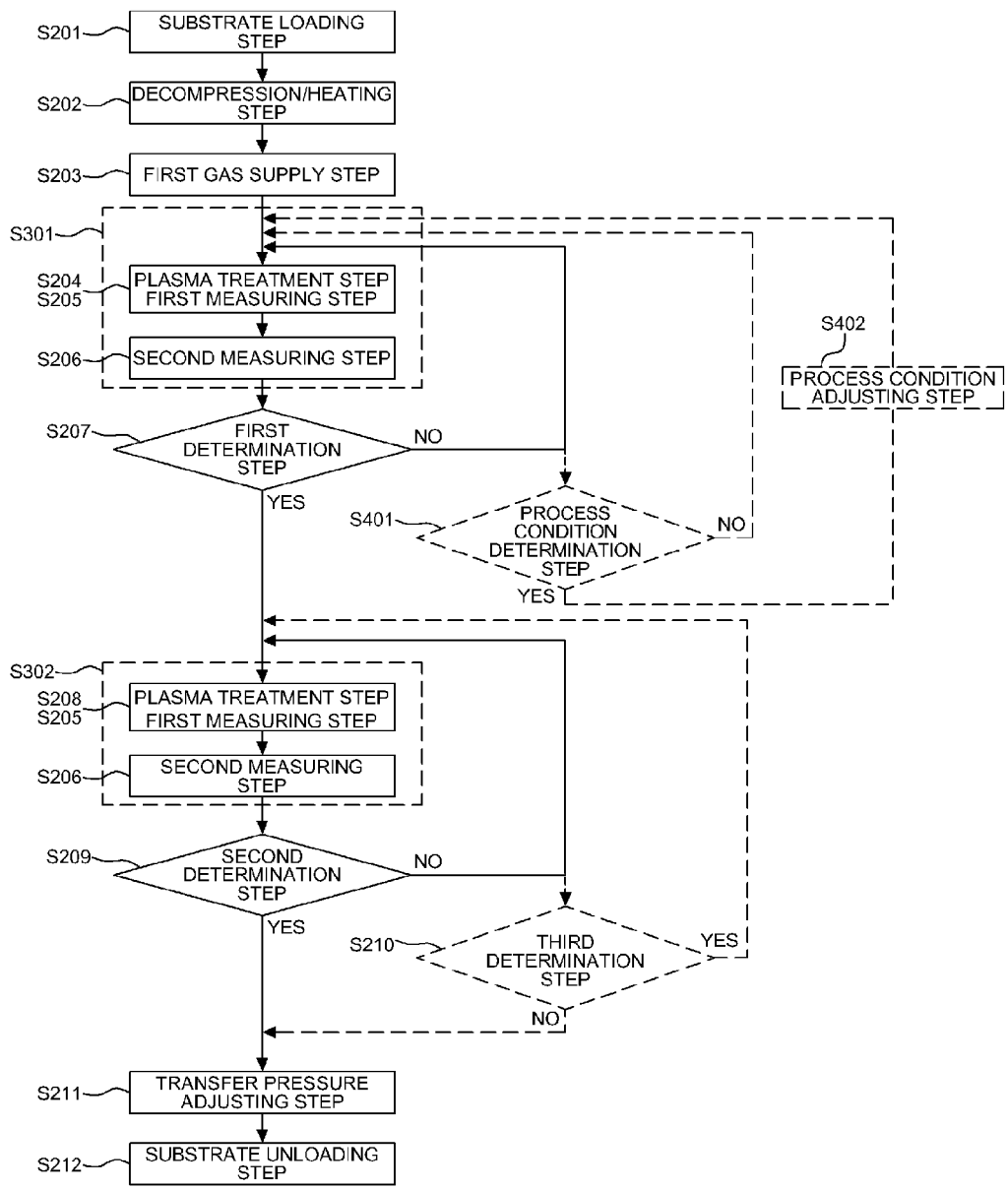
FIG. 4 is a flowchart illustrating a substrate processing step according to the embodiment described herein.
Figure 5:
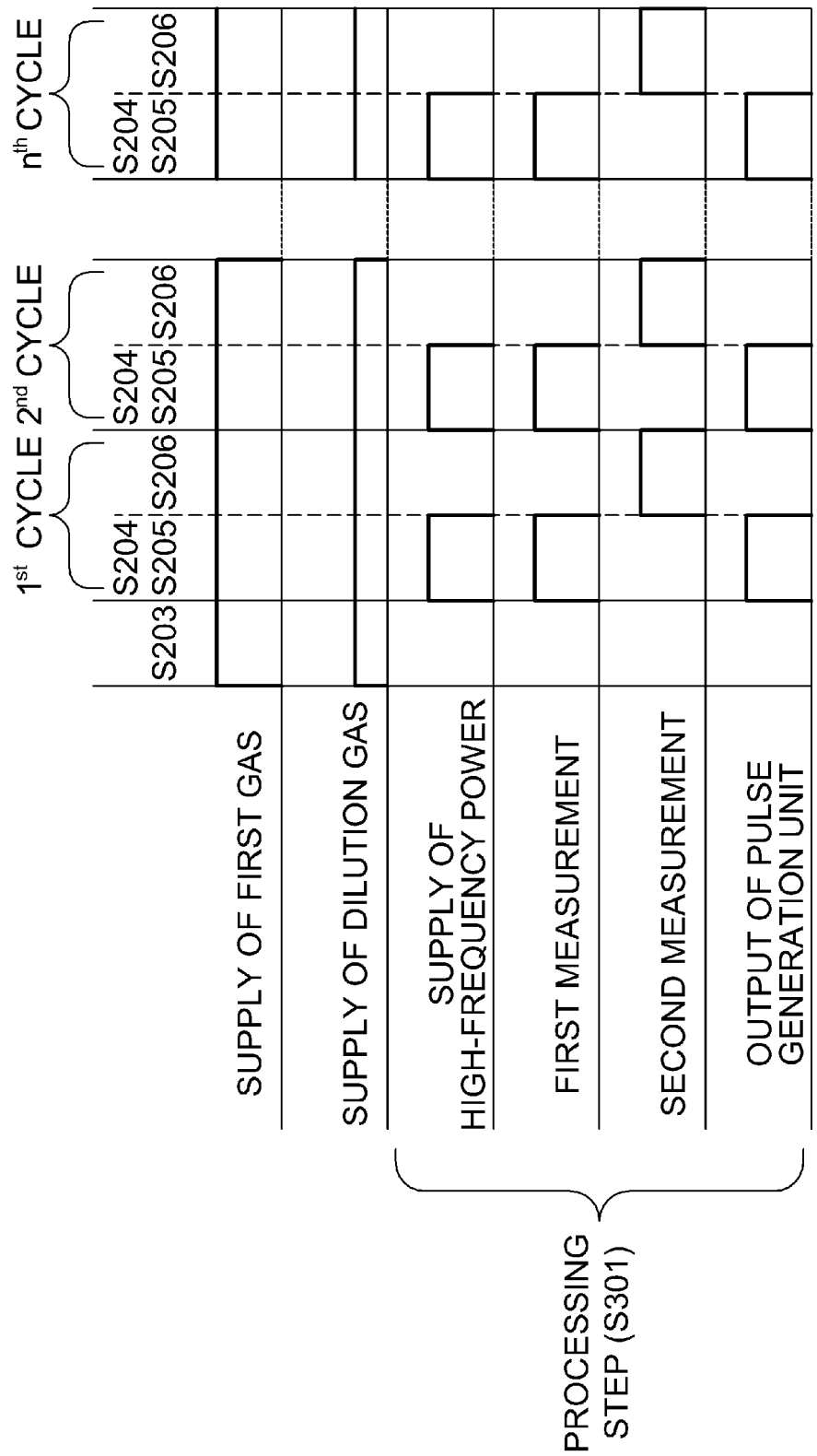
FIG. 5 is a sequence diagram of the substrate processing step according to the embodiment described herein.

Next, a method of forming a silicon nitride film (SiN film) on a substrate will be described as an example of a step of manufacturing a semiconductor device using a process furnace of the above-described substrate processing apparatus, with reference to FIGS. 4 and 5. The SiN film is used as an insulation film, for example. In the following descriptions, the components constituting the substrate processing apparatus are controlled by the controller 260.

In this specification, "wafer" indicates "a wafer itself", or indicates "a stacked body (aggregate) of the wafer and a predetermined film or layer formed on the wafer". That is, a wafer and a predetermined layer or film formed on the surface of the wafer may be collectively referred to as "wafer". In this specification, "surface of wafer" indicates "the surface (exposed surface) of a wafer itself or the surface of a predetermined layer or film formed on the wafer", i.e. "the uppermost surface of the wafer as a stacked body".

Thus, in this specification, "supplying a predetermined gas to a wafer" may indicate "directly supplying the predetermined gas onto the surface (exposed surface) of the wafer", or "supplying the predetermined gas onto a layer or film formed on the wafer, i.e. the uppermost surface of the wafer as a stacked body". In this specification, "forming a predetermined layer or film on a wafer" may indicate "directly forming the predetermined layer or film on the surface (exposed surface) of the wafer", or "forming the predetermined layer (or film) on a layer or film formed on the wafer, i.e. the uppermost surface of the wafer as a stacked body".

Furthermore, when a term "substrate" is used in this specification, it may indicate that a term "wafer" is used. In this case, the wafer may be replaced with the substrate in the above descriptions.

Hereafter, the substrate processing step will be described with reference to FIG. 4.

[Substrate Loading Step S201]

The substrate processing step begins with a substrate loading step of loading a wafer 200 into the process chamber 201. Specifically, the substrate support 210 is lowered by the elevating mechanism 218, and the lift pins 207 protrude from the upper surface of the substrate support 210 through the through-holes 214. After the inner pressure of the process chamber 201 or the transfer chamber 203 is adjusted to a predetermined pressure, the gate valve 1490 is opened. Through the gate valve 1490, the wafer 200 is placed on the lift pins 207. After the wafer 200 is placed on the lift pins 207, the gate valve 1490 is closed. As the substrate support 210 is lifted to a predetermined position by the elevating mechanism 218, the wafer 200 is placed on the substrate support 210 from the lift pins 207.

[Decompression and Heating Step S202]

Next, the process chamber 201 is exhausted through the exhaust pipe 224 such that the inner pressure of the process chamber 201 becomes a predetermined degree of vacuum. At this time, based on a pressure value measured by a pressure sensor (not illustrated), the opening degree of the APC valve serving as the pressure controller 227 is feedback-controlled. Based on a temperature measured by a temperature sensor (not illustrated), the amount of power supplied to the heater 213 is feedback-controlled such that the inner temperature of the process chamber 201 becomes a predetermined temperature. Specifically, the substrate support 210 is heated by the heater 213 in advance. When the temperature of the wafer 200 or the substrate support 210 is stabilized, the state is maintained for a predetermined time. At this time, when moisture or exhaust gas from a member remains in the process chamber 201, the moisture or exhaust gas can be removed by vacuum exhaust or purge through the supply of N2 gas. In this way, the preparation before a film forming process is completed. The process chamber 201 may be exhausted until the inner pressure of the process chamber 201 is set to a vacuum degree which the inner pressure can reach at a time.

At this time, the heater 213 is maintained at a constant temperature ranging from 100° C. to 600° C., preferably from 100° C. to 500° C., and more preferably from 250° C. to 450° C.

The electric potential of the wafer 200 may be adjusted to a predetermined electric potential by the bias adjusting unit 257 and the bias electrode 256.

When the temperature of the wafer 200 is stabilized, the state of the wafer 200 or the process chamber 201 may be measured by at least one of the first to third measuring units 271a through 273a, and the measured initial value may be written to a component such as the memory device 260c or the RAM 260b of the controller 260. Specifically, information on the position (level) of the surface of the wafer 200, measured through the third measuring unit 273a, is stored in at least one of the memory device 260c and the RAM 260b.

After the inner atmosphere of the process chamber 201 or the state (temperature or electric potential) of the wafer 200 is stabilized, steps S203 through S207 are performed.

[Processing Step S301]

A step of modifying the silicon nitride (SiN) film formed on the wafer 200 [processing step S301] will be described in detail with reference to FIGS. 5 and 6. The processing step S301 includes at least a plasma treatment step S204, a first measuring step S205 and a second measuring step S206. The processing step S301 may further include a first gas supply step S203. The processing step S301 may also be referred to as a modification step or treatment step. The SiN film is formed on the wafer 200 using, for example, dichlorosilane ($SiH_2Cl_2$, abbreviated to DCS) gas and ammonia ($NH_3$) gas while impurities such as chlorine remains in the SiN film.

[First Gas Supply Step S203]

At the first gas supply step S203, a hydrogen-containing gas is supplied as a first gas (process gas) into the process chamber 201 through the first gas supply system. Specifically, the hydrogen-containing gas supplied from the first gas supply source 113 is supplied to the substrate processing apparatus 100, after the flow rate thereof is adjusted by the MFC 115. The hydrogen-containing gas of which the flow rate was adjusted is supplied into the process chamber 201 in a decompressed state through the buffer chamber 232 and the holes 234a. While the process chamber 201 is continuously exhausted by the exhaust system, the inner pressure of the process chamber 201 is adjusted to a predetermined pressure (first pressure). At this time, with the inner pressure of the process chamber 201 at a first pressure of 10 Pa to 1,000 Pa, the hydrogen-containing gas is supplied into the process chamber 201. In this way, the hydrogen-containing gas is supplied onto the wafer 200. The process gas may include any one or both of a gas aimed at removing impurities in the film formed on the wafer 200 and a gas aimed at making up for an element constituting the film formed on the wafer 200 or modifying the quality of the film. The hydrogen-containing gas according to an embodiment may include any one or both of hydrogen ($H_2$) gas and ammonia ($NH_3$) gas, for example. The hydrogen element may remove chlorine in the film formed on the wafer 200, and the nitrogen element may make up for nitrogen of the film formed on the wafer 200. The first gas is continuously supplied until a transfer pressure adjusting step S209 is started. While the first gas is supplied, dilution gas may be supplied. Here, $NH_3$ gas is exemplified.

[Plasma Treatment Step S204]

After the supply of the first gas onto the wafer 200 is started, high-frequency power is supplied to the electrode unit 244 through the matcher 251 from the high-frequency power supply 252. As high-frequency power is supplied to the electrode unit 244, plasma (active species) of the first gas is generated in the process chamber 201. Then, a plasma treatment step S204 is performed as an activation step. When an activated hydrogen-containing gas is supplied to the SiN film formed on the wafer 200, the SiN film is modified while chlorine in the SiN film is removed. Plasma is periodically generated by an output of the pulse generation unit 254 connected to the high-frequency power supply 252. A pulse signal of the pulse generation unit 254 is supplied to the controller 260 or the lock-in amplifier 274 as well as the high-frequency power supply 252, and used as a signal for processing measurement information which can be obtained through the first to third measuring units 271a through 273a described later.

For example, depending on parameters such as the inner pressure of the process chamber 201, the flow rate of $NH_3$ gas, the temperature of the wafer 200, and the power of the high-frequency power supply 252, the SiN film is modified to have a predetermined thickness, a predetermined distribution and a predetermined penetration depth of nitrogen.

At the plasma treatment step S204, the amount of charged particles supplied to the wafer 200 may be controlled by adjusting the electric potential of the bias electrode 256 installed in the substrate placing table 212 through the bias adjusting unit 257.

[First Measuring Step S205]

While plasma is generated, the first measuring step S205 is performed. At the first measuring step S205, the amount of impurity desorbed from the film formed on the wafer 200 is measured through any one or both of the first and second measuring units 271a and 272a, in order to acquire first measurement data. Specifically, light is emitted from the impurity by the plasma generated in the process chamber 201, and the first measuring unit 271a measures the intensity of the light from the spectrum of the light, in order to generate the first measurement data. The first measurement data is transmitted to the lock-in amplifier 274 and the controller 260.

The valves 238 and 272b installed at the second measuring unit introduction pipe 225 connected to the exhaust pipe 224 are opened to introduce a part of gas exhausted from the process chamber 201 to the measuring chamber 272c of the second measuring unit 272a. While the gas introduced into the measuring chamber 272c is analyzed by the mass spectrometer serving as the second measuring unit 272a, the first measurement data based on the impurity are generated. The measurement through the measuring chamber 272c can reduce noise caused by plasma in the process chamber 201. As the inside of the measuring chamber 272c is exhausted by the vacuum pump 223, the inner pressure of the measuring chamber 272c is maintained at a predetermined pressure.

[Second Measuring Step S206]

The second measuring step S206 is performed through any one or two or more of the first to third measuring units 271a through 273a, while no plasma is generated. The first and second measuring units 271a and 272a may perform the same measurement as the first measuring step S205, in order to generate second measurement data. The second measurement data is transmitted to the lock-in amplifier 274 and the controller 260. Based on the first measurement data which can be obtained at the first measuring step S205 while plasma is generated and the second measurement data which can be obtained at the second measuring step S206 while no plasma is generated, it is possible to reduce noise contained in the measurement data which can be obtained at the first measurement step S205. When the displacement measuring unit of the third measuring unit 273a is used, the third measuring unit 273a measures a distance to the surface of the wafer 200 by irradiating laser light onto the wafer 200. By measuring the distance to the surface of the wafer 200, bending of the wafer 200 can be measured. As the characteristics of the film formed on the wafer 200 is changed depending on the type of the film, the stress of the film is changed. When the stress of the film is changed, the wafer 200 may be bent. Based on the bending of the wafer 200, the situation of the film characteristics may be examined.

Hereafter, a process in which the lock-in amplifier 274 computes measurement data will be described. The first and second measurement data transmitted to the lock-in amplifier 274 are computed on the basis of a pulse transmitted from the pulse generation unit 254, and measurement data (measurement value) is generated. The generated measurement data is transmitted to the controller 260. The controller 260 computes process data (accumulated measurement value) based on the received measurement data.

[First Determination Step S207]

After the second measuring step S206 is ended, the controller 260 determines whether the SiN film formed on the wafer 200 starts to be modified, based on the process data. For example, the controller 260 determines whether the characteristics of the SiN film formed on the wafer 200 starts to be changed.

The concentration of impurity in the SiN film from the surface to the lowermost portion of the SiN film may not be uniform. For example, the amount of impurity at the surface of the SiN film may be smaller than that at the lowermost portion of the SiN film. Furthermore, the amount of impurity in a SiN film of a specific wafer 200 may be smaller than that in a SiN film of another wafer 200. In this case, the amount of impurity desorbed immediately after the process is started may be reduced, the process may be ended before a desired film characteristics is obtained, or a plurality of processed wafers 200 may have different characteristics. The determination of whether the SiN film starts to be modified can achieve the uniformity in film characteristics of the plurality of wafers 200

The first determination step is performed on the basis of the process data (accumulated measurement value) obtained from the first and second measurement data. At the first determination step, the controller 260 determines whether the accumulated measurement value is equal to or greater than a first specified value. When the accumulated measurement value is equal to or greater than the first specified value, the controller 260 determines that the result is Yes (Y), and performs a second processing step S302. On the other hand, when the accumulated measurement value is less than the first specified value, the controller 260 determines that the result is No (N), and the plasma treatment step S204 of the first processing step S301 and the first and second measuring steps S205 and S206 are performed again.

Figure 6:
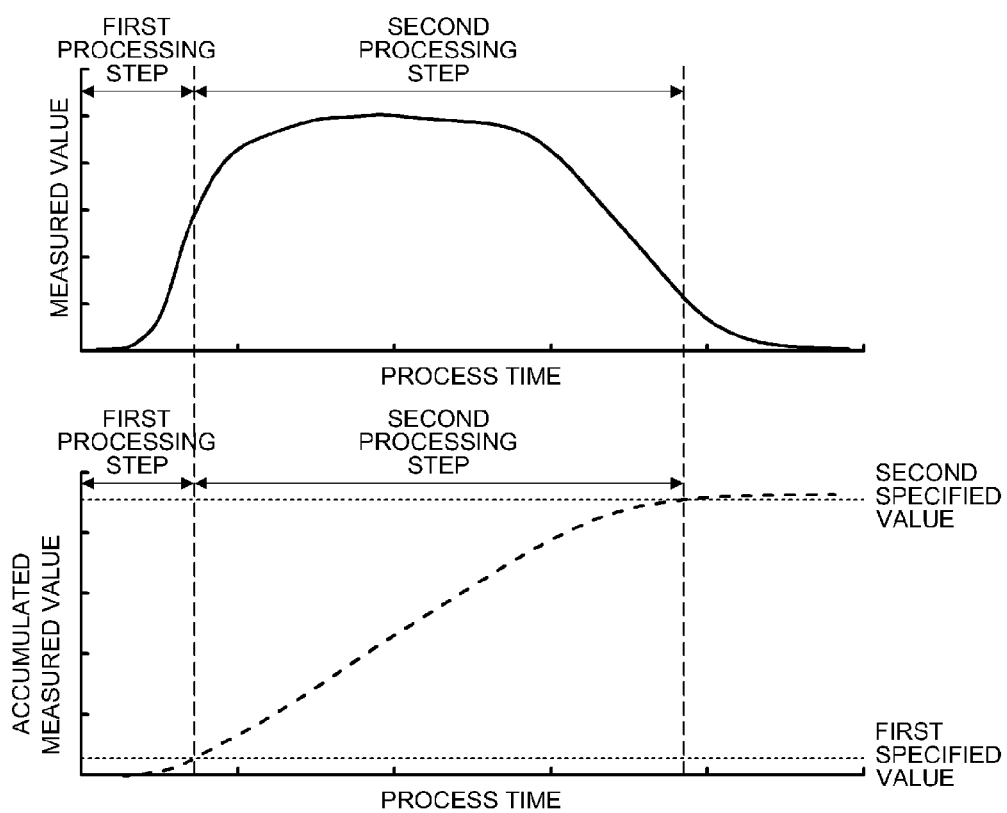
FIG. 6 is a diagram illustrating the relation between a measured value and a process time and the relation between an accumulated measured value and a process time according to the embodiment described herein.

The determination may be performed by calculating inclination data of a graph which indicates a measurement value with respect to a process time in FIG. 6. For example, when the inclination of the graph falls within a predetermined range, the controller 260 determines that the result is Yes, and when the inclination of the graph deviates from the predetermined range, the controller 260 determines that the result is No. That is, when the slope of the graph has a positive value, the controller 260 may determine that the result is Yes.

In the present embodiment, the determination based on the accumulated measurement value is exemplified. However, the determination may be performed based on a measurement value. As described above, however, when the amount of impurity is uneven along the thickness direction of the film, the determination may not be normally performed. Therefore, the accumulated measurement value may be preferably used for determination.

[Process Condition Determination Step S401]

When the result of the first determination step S207 is No, a process condition determination step S401 and a process condition adjusting step S402, which are indicated by a dotted line, may be additionally performed. The process condition determination step S401 is performed using at least one of the accumulated measurement value data and the measurement value data and at least one of process time data and repetition count data. For example, when any one or both of the accumulated measurement value data and the measurement value data does not reach a predetermined value during a predetermined process time, the controller 620 determines that a desired process is not being performed (Yes), and performs the process condition adjusting step S402. On the other hand, when any one or both of the accumulated measurement value data and the measurement value data reaches the predetermined value, the controller 620 determines that the desired process is being performed (No), and performs the processing step S301.

[Process Condition Adjusting Step S402]

At the process condition adjusting step S402, the high-frequency power supply 252 is controlled to increase the high-frequency power supplied at the plasma treatment step S204, for example. The amount of power supplied to the heater 213 may be increased. The bias adjusting unit 257 may be controlled to adjust a bias supplied to the bias electrode 256.

[Second Processing Step S302]

The second processing step S302 includes a second plasma treatment step S208, the first measuring step S205 and the second measuring step S206. The second plasma treatment step S208 may be performed in the same manner as the first plasma treatment step S208 or a different manner from the first plasma treatment step S208. When the second plasma treatment step S208 is performed in a different manner from the first plasma treatment step S208, the amount of high-frequency power may be controlled to a smaller amount than the amount of high-frequency power supplied at the first plasma treatment step S204.

[Second Determination Step S209]

After the second processing step S302 is performed, a second determination step S209 is performed. At the second determination step, the controller 620 determines whether the first measurement data obtained at the second processing step S302 and the second process data obtained from the second measurement data are equal to or greater than a second specified value. That is, the controller 620 determines whether the SiN film formed on the wafer 200 is sufficiently modified. When the second process data is less than the second specified value, the second processing step S302 is performed. When the second process data is equal to or greater than the second specified value, the controller 620 determines that the result is Yes, and performs the transfer pressure adjusting step S211, and when the second process data is less than the second specified value, the controller 620 determines that the result is No, and performs the second processing step S302. When the controller 620 determines that the result is No because the second process data is less than the second specified value, a third determination step S210 indicated by a dotted line may be additionally performed before the second processing step S302.

The determination may be performed by calculating inclination data of a graph which indicates a measurement value with respect to a process time in FIG. 6. For example, when the slope of the graph falls within a predetermined range, the controller 620 determines that the result is Yes, and when the slope of the graph deviates from the predetermined range, the controller 620 determines that the result is No. That is, when the inclination of the graph has a negative value, the controller 620 may determine that the result is Yes.

[Third Determination Step S210]

At the third determination step S210, the controller 620 determines whether the wafer 200 is deformed, using the third measuring unit 273a. The determination is performed by comparing the initial value data measured at the decompression and heating step S202 to the data measured by the third measuring unit 273a at the third determination step S210. When a difference between the data measured at the third determination step S210 and the initial value data falls within a predetermined range, the controller 620 determines that the result is Yes, and performs the second processing step S302. On the other hand, when the difference between the data measured at the third determination step S210 and the initial value data deviates from the predetermined range, the controller 620 determines that the result is No, stops the process, and performs a transfer pressure adjusting step S211. During the plasma treatment steps S204 and S208, the wafer 200 may be temporarily deformed (bent) by the energy of plasma or heat of reaction. In this case, a waiting step may be performed until the second processing step S302 is repeated to recover the deformation to the original state.

[Transfer Pressure Adjusting Step S211]

At the transfer pressure adjusting step S211, the output of the high-frequency power supply 252 is turned off, the supply of the process gas is stopped, the inner atmosphere of the process chamber 201 is replaced by supplying an inert gas into the process chamber 201 through the inert gas supply unit, and the inner pressure of the process chamber 201 is adjusted to a predetermined transfer pressure.

[Substrate Unloading Step S212]

After the transfer pressure adjusting step S211 is performed, the substrate placing table 212 is lowered to the wafer transfer position by the elevating mechanism 218, and the lift pins 207 protrude from the upper surface of the substrate support 210 through the through-holes 214. The gate valve 1490 is opened, and the wafer 200 is transferred out through the gate value 1490 from the lift pin 207. In this way, the substrate processing process is performed.

Although the embodiment has been specifically described, the technique described herein is not limited to the above-described embodiment, and may be modified in various manners without departing from the scope.

In the above-described embodiment, performing a plasma treatment on the SiN film formed on the wafer 200 has been exemplified. However, the technique described herein is not limited thereto. For example, while the SiN film is formed, the processing step S301 may be performed as the treatment step. Specifically, while a film is formed by cyclically and alternately supplying the first and second gases, any one or both of the first processing step S301 and the processing step S302 may be performed at each cycle.

In the above-described embodiment, the desorption of impurity has been exemplified as an example of a modification process. However, the technique described herein may be applied to another process. For example, the technique described herein may be applied to a diffusion process using plasma, an oxidation process, a nitridation process, an oxy-nitridation process, a reduction process, an oxidation reduction process, an etching process and a heating process. For example, the technique described herein may be applied even when the surface of the substrate or the film formed on the substrate is subjected to a plasma oxidation process or plasma nitridation process only through a reaction gas. The technique described herein may also be applied to a plasma annealing process using only a reaction gas.

In the above-described embodiment, the process of manufacturing a semiconductor device has been exemplified. However, the technique described herein can be applied to other processes as well as the process of manufacturing a semiconductor device. The technique described herein may be applied to other substrate processing processes such as a manufacturing process of a liquid crystal device, a manufacturing process of a solar battery, a manufacturing process of a light emitting device, a manufacturing process of a glass substrate, a processing process of a ceramic substrate, a substrate processing process and a processing process of a conductive substrate.

In the above-described embodiment, the process of modifying the SiN film using DCS gas and NH$_3$ gas has been exemplified. However, the technique described herein may be applied when the film is modified using another gas. The technique described herein may also be applied when modifying an oxygen-containing film, a nitrogen-containing film, a carbon-containing film, a boron-containing film, a metal containing film and combinations thereof. For example, the technique described here may also be applied when modifying films such as AlO film, ZrO film, HfO film, HfAlO film, ZrAlO film, SiC film, SiCN film, SiBN film, TiN film, TiC film and TiAlC film.

In the described embodiment, the configuration for processing one substrate in one process chamber has been exemplified. However, the technique described herein is not limited thereto. The technique described herein may also be applied to an apparatus in which a plurality of substrates are arranged in the horizontal or vertical direction, for example.

According to the technique described herein, the uniformity of the film characteristics can be improved after the substrate is processed.

What is claimed is:

1. A method of manufacturing a semiconductor device, comprising:
   (a) loading a substrate into a process chamber;
   (b) processing the substrate by performing:
      (b-1) supplying and exhausting a process gas into and from the process chamber without activating the process gas;
      (b-2) supplying and exhausting the process gas into and from the process chamber while activating the process gas;
      (b-3) measuring an amount of impurity desorbed from the substrate while performing (b-2); and
      (b-4) measuring a gas exhausted from the process chamber after performing (b-3);
   (c) calculating a process data based on: a first measurement data obtained by repeating (b-3); and a second measurement data obtained by repeating (b-4); and
   (d) determining whether to terminate (b) based on the process data.

2. The method of claim 1, further comprising: (e) adjusting an electric power used for activating the process gas in (b-2) based on the process data before performing (d).

3. The method of claim 1, wherein a portion of the gas exhausted from the process chamber and introduced into a measurement chamber is analyzed in (b-3).

4. The method of claim 2, wherein a portion of the gas exhausted from the process chamber and introduced into a measurement chamber is analyzed in (b-3).

5. The method of claim 1, wherein the amount of impurity desorbed from the substrate is measured in (b-3) by measuring an intensity of light emitted from the impurity, the light being generated by plasma generated by activating the process gas.

6. The method of claim 2, wherein the amount of impurity desorbed from the substrate is measured in (b-3) by measuring an intensity of light emitted from the impurity, the light being generated by plasma generated by activating the process gas.

7. The method of claim 3, wherein the amount of impurity desorbed from the substrate is measured in (b-3) by measuring an intensity of light emitted from the impurity, the light being generated by plasma generated by activating the process gas.

8. The method of claim 4, wherein the amount of impurity desorbed from the substrate is measured in (b-3) by measuring an intensity of light emitted from the impurity, the light being generated by plasma generated by activating the process gas.

9. The method of claim 1, further comprising:
   (f) measuring a stress of the substrate before and after performing (b-2); and
   (g) terminating (b) based on the stress measured in (f).

10. The method of claim 2, further comprising:
    (f) measuring a stress of the substrate before and after performing (b-2); and
    (g) terminating (b) based on the stress measured in (f).

11. The method of claim 3, further comprising:
    (f) measuring a stress of the substrate before and after performing (b-2); and
    (g) terminating (b) based on the stress measured in (f).

12. The method of claim 5, further comprising:
    (f) measuring a stress of the substrate before and after performing (b-2); and
    (g) terminating (b) based on the stress measured in (f).

13. The method of claim 6, further comprising:
(f) measuring a stress of the substrate before and after performing (b-2); and
(g) terminating (b) based on the stress measured in (f).

14. The method of claim 7, further comprising:
(f) measuring a stress of the substrate before and after performing (b-2); and
(g) terminating (b) based on the stress measured in (f).

15. The method of claim 8, further comprising:
(f) measuring a stress of the substrate before and after performing (b-2); and
(g) terminating (b) based on the stress measured in (f).

* * * * *